United States Patent
Cui et al.

(10) Patent No.: US 11,710,801 B2
(45) Date of Patent: Jul. 25, 2023

(54) SILICON CARBIDE-BASED FULL-SPECTRUM-RESPONSIVE PHOTODETECTOR AND METHOD FOR PRODUCING SAME

(71) Applicant: Taiyuan University of Technology, Shanxi (CN)

(72) Inventors: Yanxia Cui, Shanxi (CN); Yaping Fan, Shanxi (CN); Xianyong Yan, Shanxi (CN); Guohui Li, Shanxi (CN); Yuan Tian, Shanxi (CN)

(73) Assignee: Taiyuan University of Technology, Taiyuan (CN)

( * ) Notice: Subject to any disclaimer, the term of this patent is extended or adjusted under 35 U.S.C. 154(b) by 0 days.

(21) Appl. No.: 17/514,526

(22) Filed: Oct. 29, 2021

(65) Prior Publication Data
US 2022/0052218 A1 Feb. 17, 2022

(30) Foreign Application Priority Data
Mar. 12, 2021 (CN) .......................... 202110270328.5

(51) Int. Cl.
*H01L 31/101* (2006.01)
*H01L 31/0224* (2006.01)
(Continued)

(52) U.S. Cl.
CPC .. *H01L 31/1013* (2013.01); *H01L 31/022408* (2013.01); *H01L 31/1085* (2013.01); *H01L 31/028* (2013.01)

(58) Field of Classification Search
CPC ......... H01L 31/1013; H01L 31/022408; H01L 31/1085; H01L 31/028; H01L 31/0224;
(Continued)

(56) References Cited

U.S. PATENT DOCUMENTS

| | | | |
|---|---|---|---|
| 2002/0121641 A1* | 9/2002 | Alok | H01L 21/0445 257/E21.054 |
| 2011/0110628 A1* | 5/2011 | Okamoto | H01L 31/02325 257/432 |

(Continued)

FOREIGN PATENT DOCUMENTS

| | | | | |
|---|---|---|---|---|
| CN | 110364584 A | | 10/2019 | |
| CN | 113013278 A | * | 6/2021 | ....... H01L 31/02161 |
| WO | WO-2013160968 A1 | * | 10/2013 | ............. H01L 31/10 |

OTHER PUBLICATIONS

N. A. Cinel, S. Bütün and E. Özbay, "Plasmonic nanoparticle based nanobiosensors and nanophotodetectors," 2014 16th International Conference on Transparent Optical Networks (ICTON), Graz, Austria, 2014, pp. 1-5, doi: 10.1109/ICTON.2014.6876363. (Year: 2014).*

(Continued)

*Primary Examiner* — Sitaramarao S Yechuri

(57) ABSTRACT

The present application relates to semiconductor photodetectors, in particular to a silicon carbide-based UV-visible-NIR full-spectrum-responsive photodetector and a method for fabricating the same. The photodetector includes a silicon carbide substrate, and metal counter electrodes and a surface plasmon polariton nanostructure arranged thereon. The silicon carbide substrate and the metal counter electrodes constitute a metal-semiconductor-metal photodetector with coplanar electrodes. When the ultraviolet light is input, free carriers directly generated in silicon carbide are collected by an external circuit to generate electrical signals. When the visible light is input, hot carriers generated in the surface plasmon polariton nanostructure tunnel into the silicon carbide semiconductor to become free carriers to generate electrical signals.

9 Claims, 3 Drawing Sheets

(51) Int. Cl.
*H01L 31/108* (2006.01)
*H01L 31/028* (2006.01)

(58) Field of Classification Search
CPC .............. H01L 31/09; H01L 31/0312; H01L 31/02161; H01L 31/1804; G02B 5/008
See application file for complete search history.

(56) References Cited

U.S. PATENT DOCUMENTS

| | | |
|---|---|---|
| 2011/0175183 A1 | 7/2011 | Nabet et al. |
| 2013/0020491 A1* | 1/2013 | Mazzillo ............ G01J 1/429 257/434 |
| 2018/0047856 A1 | 2/2018 | Cai et al. |

OTHER PUBLICATIONS

P. G. Neudeck, "Silicon Carbide Electronic Devices" Encyclopedia of Materials: Science and Technology, ISBN 978-0-08-043152-9, 2001 Elsevier Ltd (Year: 2001).*

Wu Zhengyun et al. "Fabrication of MSM structure UV photodetector on 4H—SiC" Chinese Journal of Quantum Electronics 21.2(2004):269-272.

Wu, Z., et al. "Demonstration of the first 4H—SiC metal-semiconductor-metal ultraviolet photodetector." Materials ence Forum 457-460(2004):1491-1494.

Lien, W. C., et al. "4H—SiC Metal-Semiconductor-Metal Ultraviolet Photodetectors in Operation of 450° C." IEEE Electron Device Letters 33.11(2012):1586-1588.

* cited by examiner

SILICON CARBIDE-BASED FULL-SPECTRUM-RESPONSIVE PHOTODETECTOR AND METHOD FOR PRODUCING SAME

CROSS-REFERENCE TO RELATED APPLICATIONS

This application claims the benefit of priority from Chinese Patent Application No. 202110270328.5, filed on Mar. 12, 2021. The content of the aforementioned application, including any intervening amendments thereto, is incorporated herein by reference in its entirety.

TECHNICAL FIELD

The present application relates to semiconductor photodetectors, in particular to a silicon carbide-based ultraviolet-visible-near-infrared full-spectrum-responsive photodetector and a method for producing the same.

BACKGROUND

Silicon carbide is a wide-bandgap semiconductor material, which exhibits high thermal conductivity, large electron saturated drift velocity, and desirable stability. Compared with traditional semiconductor materials, the silicon carbide material shows higher stability under the extreme condition, such as high temperature, high pressure, high frequency, and strong radiation.

The silicon carbide can be used as the light absorption layer of an ultraviolet photodetector. The existing silicon carbide ultraviolet photodetectors generally have a PIN structure, an avalanche diode structure, a metal-insulator-semiconductor structure, a vertical metal-semiconductor-metal structure or a metal-semiconductor-metal structure with coplanar electrodes. The metal-semiconductor-metal silicon carbide ultraviolet photodetector with coplanar electrodes is obtained by simply fabricating a metal counter electrode on a silicon carbide substrate.

With regard to the metal-semiconductor-metal silicon carbide ultraviolet photodetector, the key to achieving a large photo-to-dark current ratio lies in the formation of a Schottky junction contact between the metal and the semiconductor during the manufacturing of the metal electrode. A pair of electrodes happens to form two Schottky junctions, which are connected in series back to back, and the higher Schottky barrier can effectively prevent the current in the external circuit from injecting into the silicon carbide semiconductor. Comparison between performances of metal-semiconductor-metal silicon carbide ultraviolet photodetectors respectively made of nickel electrodes and aluminum electrodes has been reported in 2004 (Zheng-Yun W U, Xin X B, Yan F, et al. Fabrication of MSM structure UV photodetector on 4H-SiC[J]. Chinese Journal of Quantum Electronics, 2004, 21, 269-272), and the results demonstrated that the dark current of the nickel electrode device is an order of magnitude lower than that of the aluminum electrode device, confirming that the Schottky barrier formed by nickel and silicon carbide is higher than that formed by aluminum and silicon carbide. Therefore, the nickel electrode can better suppress the injection of the current from the external circuit.

In addition, the characteristics of the silicon carbide substrate will also seriously affect the dark current level of the metal-semiconductor-metal silicon carbide-based ultraviolet photodetector. In 2004, Wu zhengyun et al. (Wu Z, Xin X, Yan F, et al. Demonstration of the first 4H-SiC metal-semiconductor-metal ultraviolet photodetector[J]. Materials Science Forum, 2004, 457-460:1491-1494) in China produced metal-semiconductor-metal silicon carbide-based ultraviolet photodetectors based on the p-type silicon carbide substrate (intrinsic carrier concentration: $3e16/cm^3$) and the n-type silicon carbide substrate (intrinsic carrier concentration: $3e15/cm^3$), respectively, and compared their performances. The investigation results showed that the device with the p-type silicon carbide substrate has a lower dark current. Subsequently, Wei-Cheng Lien et al. (Lien W C, Tsai D S, Lien D H, et al. 4H-SiC Metal-Semiconductor-Metal Ultraviolet Photodetectors in Operation of 450° C.[J]. Electron Device Letters, IEEE, 2012, 33(11):p. 1586-1588) in the US manufactured a metal-semiconductor-metal ultraviolet photodetector, in which a 20 nm Cr/150 nm Pd double-layer composite electrode and the p-type silicon carbide substrate (intrinsic carrier concentration: $2e15/cm^3$) are used to form a Schottky junction contact. The metal-semiconductor-metal ultraviolet photodetector has a dark current of 10 e-10 A at a bias of 5 V, and the photo-to-dark current ratio is as high as the 10e5 level.

If the metal-semiconductor-metal ultraviolet photodetector is made on a semi-insulating silicon carbide-based substrate, it is beneficial to achieve better photodetection performance, which is because its intrinsic carrier concentration (ranging from $1e13/cm^3$ to $1e15/cm^3$) is lower than that of the doped semiconductor. When a suitable bias voltage is applied, one of the Schottky junctions in a metal-semiconductor-metal device disappears, and intrinsic carriers will participate in the electric conduction, which will cause a relatively large dark current in the circuit due to the higher intrinsic carrier concentration. By comparison, the extremely low intrinsic carrier concentration of the semi-insulating silicon carbide-based semiconductor ensures that the dark current in the circuit can be maintained at an extremely low level even when an external bias voltage is applied. Under the same illumination conditions, a lower dark current will lead to a higher the photo-to-dark current ratio, indicating that the device has a higher detectivity.

Due to the limitation of the bandgap, the silicon carbide-based photodetectors cannot respond to visible light whose photon energy is greater than its bandgap, which limits their applications to a certain extent. For example, some industrial controls require to be performed under high-temperature conditions, and at this time, the silicon photodetectors cannot operate normally due to the poor high-temperature resistance of silicon materials. Therefore, it is necessary to develop a silicon carbide-based photodetector with excellent stability. The silicon carbide-based full-spectrum-responsive photodetector is expected to play an important role in the industrial control under the extreme environment.

SUMMARY

The purpose of the present application is to provide a silicon carbide-based full-spectrum-responsive photodetector to overcome the problem that the existing silicon carbide-based photodetector can only respond to the ultraviolet light.

Technical solutions of the present application are described as follows.

The present application provides a silicon carbide-based full-spectrum-responsive photodetector, comprising:

a silicon carbide substrate;

wherein a silicon surface of the silicon carbide substrate is provided with a plurality of metal counter electrodes and a surface plasmon polariton nanostructure; the plurality of metal counter electrodes are arranged on the silicon carbide substrate; the surface plasmon polariton nanostructure is arranged between the plurality of metal counter electrodes; the surface plasmon polariton nanostructure comprises a plurality of metal nanoparticles uniformly distributed on the silicon surface of the silicon carbide substrate; and a Schottky contact is formed between the plurality of metal counter electrodes and the silicon carbide substrate.

In some embodiments, the plurality of metal counter electrodes are interdigital electrodes; and the surface plasmon polariton nanostructure is uniformly distributed between the interdigital electrodes.

In some embodiments, the silicon carbide substrate is made of a semi-insulating 4H-SiC, and has an intrinsic carrier concentration of $1e13/cm^3$-$1e15/cm^3$ and a thickness of 100-800 μm; the plurality of metal counter electrodes are made of gold, silver, titanium, nickel, palladium or cadmium; and the interdigital electrodes each have a finger width of 100-300 μm, a finger spacing of 100-300 μm, an effective area of $0.1\ cm^2$ and 5-15 pairs of electrodes.

In some embodiments, the plurality of metal counter electrodes are Cr/Pd double-layer electrodes or Ag/Ti double-layer electrodes.

In some embodiments, the surface plasmon polariton nanostructure is an array structure of the plurality of metal nanoparticles; the array structure of the plurality of metal nanoparticles has a period of 50-1000 nm; the plurality of metal nanoparticles are cubic nanoparticles or cylindrical nanoparticles; and the plurality of metal nanoparticles have a side length of 20-500 nm or a diameter of 20-500 nm; and the plurality of metal nanoparticles each have a height of 20-500 nm.

In some embodiments, the plurality of metal nanoparticles each have a Cr/Au double-layer structure.

In some embodiments, the surface plasmon polariton nanostructure is a randomly-distributed island-shaped metal nanoparticle structure formed by annealing of a metal film; metal islands of the randomly-distributed island-shaped metal nanoparticle structure have an average diameter of 20-100 nm; and an average size of a gap between the metal islands is 50-300 nm.

In addition, the present application also provides a method of producing the silicon carbide-based full-spectrum-responsive photodetector, comprising:

(S1) calibrating a carbon surface and the silicon surface of the silicon carbide substrate by using an atomic force microscope; and cleaning and drying the silicon carbide substrate;

(S2) distributing the plurality of metal nanoparticles evenly on the silicon surface of the silicon carbide substrate to form the surface plasmon polariton nanostructure; and (S3) preparing the plurality of metal counter electrodes on both sides of the surface plasmon polariton nanostructure to produce the silicon carbide-based full-spectrum-responsive photodetector.

The step (S2) is performed through steps of:
putting the silicon carbide substrate into a magnetron sputtering coating chamber; coating a gold film with a thickness of 5 nm by sputtering at a rate of 0.1 nm/s on a side of the silicon carbide substrate where the silicon surface is located; transferring the silicon carbide substrate coated with the gold film to a muffle furnace; heating the muffle furnace to 500° C.; and cooling the muffle furnace to room temperature in an equal step manner within two hours to form island-shape gold nanoparticles.

The step (S3) is performed through steps of:
loading a mask on the silicon carbide substrate, and depositing a metal layer on the silicon carbide substrate by evaporation; and
removing the mask to complete a preparation of the plurality of metal counter electrodes.

The step (S2) is performed through steps of:
coating a polymethyl methacrylate (PMMA) photoresist film with a thickness of 80 nm on the silicon surface of the silicon carbide substrate through spin coating; and exposing the silicon carbide substrate coated with the PMMA photoresist film by deep ultraviolet lithography or electron beam lithography; wherein an exposure pattern is consistent with a pattern of the surface plasmon polariton nanostructure;

immersing the silicon carbide substrate into a developer solution for fixing followed by rinsing and blow drying; and producing a Cr adhesion layer with a thickness of 5 nm and an Au film with a thickness of 50 nm on a surface of the silicon carbide substrate by magnetron sputtering; immersing the silicon carbide substrate in acetone to peel off unexposed PMMA photoresist and Cr and Au thereon; and subjecting the silicon carbide substrate to blow drying to complete preparation of the surface plasmon polariton nanostructure.

Compared with the prior art, the present application has the following beneficial effects.

(1) In the silicon carbide detector provided herein, silicon carbide is used as the substrate; a surface plasmon polariton nanostructure distributed in a two-dimensional periodic array is provided on the surface of the silicon carbide; and the metal counter electrodes are arranged on both sides of the silicon carbide, so that the detector provided herein combines the advantages of the silicon carbide photodetectors and the surface plasmon polariton nanostructure, where the silicon carbide substrate and the metal counter electrode constitute a metal-semiconductor-metal photodetector with coplanar electrodes. When the ultraviolet light is input, free carriers directly generated in silicon carbide are collected by an external circuit to generate electrical signals. When the visible light is input, hot carriers generated in the surface plasmon polariton nanostructure will tunnel into the silicon carbide semiconductor to become free carriers, thereby generating electrical signals. The present application overcomes the limitation in the prior art that the silicon carbide-based photodetector can only respond to ultraviolet light, and realizes the simultaneous full-spectrum-responsive detection of ultraviolet light, visible light, and near-infrared light. Through the absorption of the ultraviolet light by the silicon carbide and the absorption of the visible light and near-infrared light by the surface plasmon polariton nanostructure, the limitation in the prior art that the response wavelength of traditional silicon carbide photodetectors is limited by the bandgap is overcome, which enables the detector not only to respond to ultraviolet light but also to respond to visible and near-infrared light, so as to realize the full-spectrum-responsive detection. Moreover, the detector has simple structure and mature preparation process.

(2) The silicon carbide is a wide-bandgap semiconductor material with great stability, and it also has the advantages of high thermal conductivity and electron saturated drift rate. Compared with the traditional semiconductor materials, the silicon carbide material can resist extreme conditions, such as high temperature, high pressure, high frequency, and strong radiation. Since both of the surface plasmon polariton nanostructure and the silicon carbide-based substrate have higher stability, the photodetector of the present application can resist even higher temperature than the traditional photodetectors.

(3) Based on the principle of surface plasmon resonance, the metal nanostructure can achieve wide-spectrum and high-efficiency light absorption, which greatly improves the responsivity of silicon carbide-based photodetectors in the spectrum of visible and near-infrared light.

Figure 1:
FIG. 1 illustrates structure of a metal-semiconductor-metal silicon carbide-based ultraviolet photodetector with coplanar electrodes in the prior art.

In the drawings, 1: silicon carbide substrate; 2: interdigital electrode; and 3: nanoparticle.

DETAILED DESCRIPTION OF EMBODIMENTS

This application will be described in detail below with reference to embodiments to make the objectives, technical solutions, and advantages of this application clearer. Obviously, provided below are merely some embodiments of the present application, which are not intended to limit the application. Other embodiments obtained by those of the ordinary skill in the art based on the embodiments provided herein without paying any creative effort shall fall within the scope of the present application.

FIG. 1 is a structural diagram of a metal-semiconductor-metal silicon carbide-based ultraviolet photodetector in the prior art.

Embodiment 1

Figure 2:
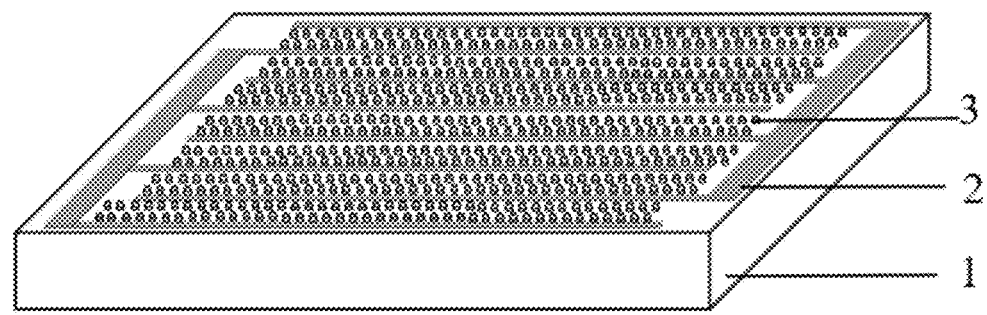
FIG. 2 depicts structure of a silicon carbide-based full-spectrum-responsive photodetector according to Embodiment 1 of the present application, where the responsivity is made by fabricating metal counter electrodes and a surface plasmon nanostructure on a silicon carbide substrate.
Figure 3:
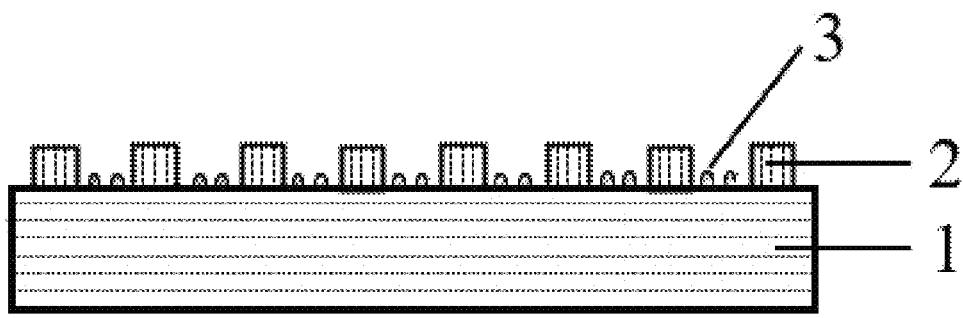
FIG. 3 is a cross-sectional view of the silicon carbide-based full-spectrum-responsive photodetector according to Embodiment 1 of the present application.

As shown in FIG. 2, a silicon carbide-based full-spectrum-responsive photodetector of the disclosure includes a silicon carbide substrate 1, where a silicon surface of the silicon carbide substrate 1 is provided with a plurality of metal counter electrodes 2 and a surface plasmon polariton nanostructure 3. The metal counter electrodes 2 are arranged on the silicon carbide substrate 1, and the surface plasmon polariton nanostructure 3 is arranged between the metal counter electrodes 2. The surface plasmon polariton nanostructure 3 includes a plurality of metal nanoparticles uniformly distributed on the silicon surface of the silicon carbide substrate 1. A Schottky contact is formed between the metal counter electrodes 2 and the silicon carbide substrate 1.

In this embodiment, the silicon carbide substrate 1 is made of a semi-insulating 4H-SiC, and has an intrinsic carrier concentration of $1e13/cm^3$-$1e15/cm^3$ and a thickness of 100-800 µm.

In this embodiment, the plurality of metal counter electrodes 2 are made of gold, silver, titanium, nickel, palladium or cadmium.

In this embodiment, the plurality of metal counter electrodes 2 are Cr/Pd double-layer electrodes or Ag/Ti double-layer electrodes.

Further, in this embodiment, the surface plasmon polariton nanostructure is a randomly-distributed island-shaped metal nanoparticle structure 3 formed by annealing of a metal film; metal islands of the randomly-distributed island-shaped metal nanoparticle structure have an average diameter of 20-100 nm; and an average size of a gap between the metal islands is 50-300 nm.

Further, in this embodiment, the interdigital electrodes 2 each have a finger width of 100-300 µm, a finger spacing of 100-300 µm, an effective area of 0.1 $cm^2$ and 5-15 pairs of electrodes.

This embodiment also provides a method of fabricating the silicon carbide-based full-spectrum-responsive photodetector, which includes the following steps.

Firstly, a carbon surface and the silicon surface of the silicon carbide substrate 1 are calibrated through an atomic force microscope, where the silicon surface has a relatively low roughness. Then the silicon carbide substrate 1 is cleaned, dried, transferred to a magnetron sputtering coating chamber, and coated with a gold film with a thickness of 5 nm on the silicon surface by sputtering at a rate of 0.1 nm/s.

The silicon carbide substrate 1 coated with a gold film is transferred to a muffle furnace, and the muffle furnace is heated to 500° C., and cooled to room temperature in an equal step manner within two hours to form island-shape gold nanoparticles. An interdigital electrode mask is loaded on the silicon carbide substrate 1 containing island-shaped golden nanoparticles, and an interdigital silver electrode with a thickness of 100 nm is deposited by evaporation at a rate of 0.1 nm/s, where the interdigital silver electrode has a finger width of 250 µm, a finger spacing of 250 µm, an effective area of 0.1 $cm^2$ and 10 pairs of electrodes.

The sample is taken out from the coating chamber, and the mask is removed to complete the preparation of the metal counter electrode 2, so that the silicon carbide-based ultraviolet-visible-near-infrared full-spectrum-responsive photodetector is obtained.

Figure 4A:
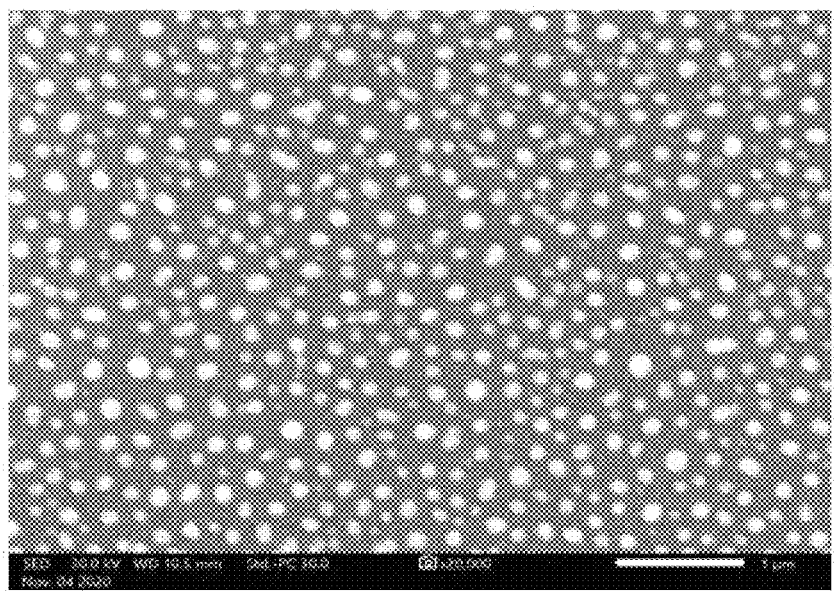
FIG. 4A is an SEM morphologic image of the surface plasmon polariton nano-island structure prepared by annealing, where an average diameter of the nano-island structure is 40 nm.
Figure 4B:
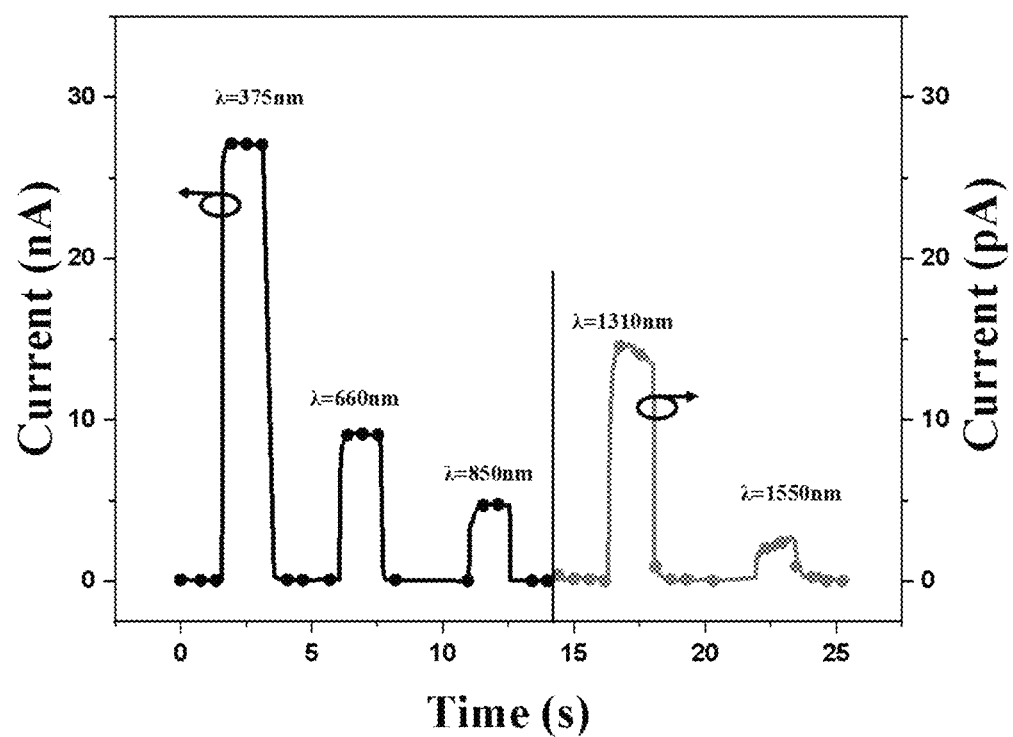
FIG. 4B shows transient photocurrent response characteristics of the silicon carbide-based ultraviolet-visible-near-infrared full-spectrum-responsive photodetector according to an embodiment of the present application, where the transient photocurrent response characteristics are measured at 375 nm, 660 nm, 850 nm, 1310 nm and 1550 nm, respectively.

The surface plasmon polariton nanostructure 3 of the photodetector prepared by the method of this embodiment is the island-shaped gold nanoparticle prepared by annealing, where the average diameter of the nano-island structure is 40 nm, and its SEM morphology is shown in FIG. 4A. FIG. 4B shows transient photocurrent response characteristics of the silicon carbide-based ultraviolet-visible-near-infrared full-spectrum-responsive photodetector in different wavebands, and it can be seen that the device exhibits electrical signal response to light of 375 nm, 660 nm, 850 nm, 1310 nm and 1550 nm under the bias of 0.1 V. Considering that the surface plasmon polariton resonance peak excited by the island-shaped gold nanoparticles contained in the device is in the visible light band, the current response of the device at wavelengths of 1310 nm and 1550 nm is relatively weak.

Embodiment 2

This embodiment provides a silicon carbide-based full-spectrum-responsive photodetector. Similar to the Embodiment 1, the silicon carbide-based full-spectrum-responsive photodetector in this embodiment also includes a silicon carbide substrate 1; where a silicon surface of the silicon carbide substrate 1 is provided with a plurality of metal counter electrodes 2 and a surface plasmon polariton nanostructure 3. The metal counter electrodes 2 are arranged on the silicon carbide substrate 1, and the surface plasmon polariton nanostructure 3 is arranged between the metal counter electrodes 2. The surface plasmon polariton nanostructure 3 includes a plurality of metal nanoparticles uniformly distributed on the silicon surface of the silicon carbide substrate 1. A Schottky contact is formed between the metal counter electrodes 2 and the silicon carbide substrate 1.

Figure 5:
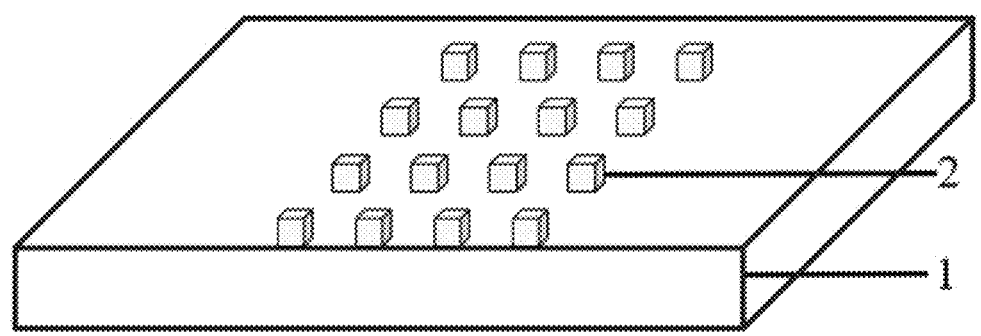
FIG. 5 illustrates a two-dimensional periodic array composed of cubic surface plasmon polariton nanostructures on a silicon carbide substrate in Embodiment 2 of the present application.
Figure 6:
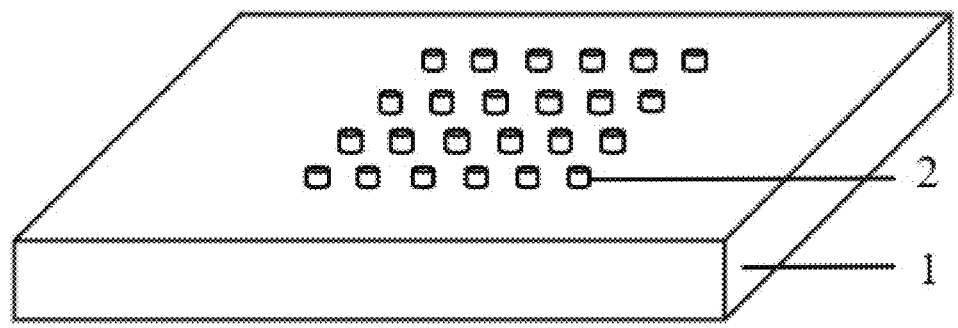
FIG. 6 illustrates a two-dimensional periodic array composed of cylindrical surface plasmon polariton nanostructures on the silicon carbide substrate in Embodiment 2 of the present application.

This embodiment is different from Embodiment 1 in the structure of the surface plasmon polariton nanostructure 3. As shown in FIGS. 5-6, in this embodiment, the surface plasmon polariton nanostructure 3 is an array structure formed by cubic nanostructures with a side length of 20-500 nm or cylindrical nanoparticles with a diameter of 20-500 nm with a period of 50-1000 nm, and the nanoparticles each have a height of 20-500 nm.

In this embodiment, the nano-particle has a Cr/Au double-layer structure. The Au nanostructure layer can stimulate the surface plasmon polariton effect to effectively broaden the spectral absorption, and the Cr nanoparticle layer can not only enhance the adhesion between the Au film and the substrate, but also can adjust height of the Au/SiC Schottky barrier to some extent.

In this embodiment, the metal counter electrode 2 is an interdigital electrode, which has a finger width of 100-300 µm, a finger spacing of 100-300 µm, an effective area of 0.1 cm$^2$ and 5-15 pairs of electrodes.

Further, this embodiment also provides a method of fabricating the silicon carbide-based full-spectrum-responsive photodetector, which includes the following steps.

Firstly, the silicon carbide substrate 1 is cleaned and dried.

Next, a polymethyl methacrylate (PMMA) photoresist film (with a thickness of 80 nm) is made on the silicon surface of the silicon carbide substrate through spin coating, and exposed by deep ultraviolet lithography or electron beam lithography, in which an exposure pattern is consistent with a pattern of the surface plasmon polariton nanostructure (a square array with length and width both of 50 nm; the periods of the row and column are both 300 nm; and 5000 units for each row and column). The silicon carbide substrate is immersed into a developer solution for fixing, rinsed and subjected to blow drying.

Then, a Cr adhesion layer with a thickness of 5 nm and an Au film with a thickness of 50 nm are deposited on a surface of the silicon carbide substrate by magnetron sputtering, and the silicon carbide substrate is immersed in acetone to peel off unexposed PMMA photoresist and Cr and Au thereon, and subjected to blow drying to complete preparation of the surface plasmon polariton nanostructure.

The metal counter electrode 2 is fabricated according to the preparation method of the surface plasmon polariton nanostructure 3, where the thickness of the PMMA film is 200 nm; the rectangular pattern with a length of 300 µm and a width of 30 µm is written on both sides of the surface plasmon polariton nanostructure 3 during the exposure. The two rectangles just sandwich all the surface plasmon polariton nanostructures 3. The 20 nm Cr/150 nm Pd composite film is deposited by magnetron sputtering. The metal counter electrode 2 is prepared after peeling off the unexposed PMMA to obtain the silicon carbide-based ultraviolet-visual-near-infrared full-spectrum-responsive photodetector.

Finally, it should be noted that the embodiments described above are only used to illustrate the technical solutions, but not intended to limit the application. It should be understood that any modifications, replacements and variations made by those of ordinary skill in the art without departing from the spirit of the application should fall within the scope of the application defined by the appended claims.

What is claimed is:

1. A silicon carbide-based full-spectrum-responsive photodetector, comprising:
   a silicon carbide substrate;
   wherein a silicon surface of the silicon carbide substrate is provided with a plurality of metal counter electrodes and a surface plasmon polariton nanostructure; the plurality of metal counter electrodes are arranged on the silicon carbide substrate; the surface plasmon polariton nanostructure is arranged between the plurality of metal counter electrodes; the surface plasmon polariton nanostructure comprises a plurality of metal nanoparticles uniformly distributed on the silicon surface of the silicon carbide substrate; and a Schottky contact is formed between the plurality of metal counter electrodes and the silicon carbide substrate;
   wherein the surface plasmon polariton nanostructure is an array structure of the plurality of metal nanoparticles; the array structure of the plurality of metal nanoparticles has a period of 50-1000 nm; the plurality of metal nanoparticles are cubic nanoparticles or cylindrical nanoparticles; the plurality of metal nanoparticles have a side length of 20-500 nm or a diameter of 20-500 nm; and the plurality of metal nanoparticles each have a height of 20-500 nm.

2. The silicon carbide-based full-spectrum-responsive photodetector of claim 1, wherein the plurality of metal counter electrodes are interdigital electrodes; and the surface plasmon polariton nanostructure is uniformly distributed between the interdigital electrodes.

3. The silicon carbide-based full-spectrum-responsive photodetector of claim 2, wherein the silicon carbide substrate is made of a semi-insulating 4H-SiC, and has an intrinsic carrier concentration of 1e13/cm$^3$-1e15/cm$^3$ and a thickness of 100-800 µm; the plurality of metal counter electrodes are made of gold, silver, titanium, nickel, palladium or cadmium; and the interdigital electrodes each have a finger width of 100-300 µm, a finger spacing of 100-300 µm, an effective area of 0.1 cm$^2$ and 5-15 pairs of electrodes.

4. The silicon carbide-based full-spectrum-responsive photodetector of claim 1, wherein the plurality of metal counter electrodes are Cr/Pd double-layer electrodes or Ag/Ti double-layer electrodes.

5. The silicon carbide-based full-spectrum-responsive photodetector of claim 1, wherein the plurality of metal nanoparticles each have a Cr/Au double-layer structure.

6. A silicon carbide-based full-spectrum-responsive photodetector, comprising:
   a silicon carbide substrate;
   wherein a silicon surface of the silicon carbide substrate is provided with a plurality of metal counter electrodes and a surface plasmon polariton nanostructure; the plurality of metal counter electrodes are arranged on the silicon carbide substrate; the surface plasmon polariton nanostructure is arranged between the plurality of metal counter electrodes; the surface plasmon polariton nanostructure comprises a plurality of metal nanoparticles uniformly distributed on the silicon surface of the silicon carbide substrate; and a Schottky contact is formed between the plurality of metal counter electrodes and the silicon carbide substrate;

wherein the surface plasmon polariton nanostructure is a randomly-distributed island-shaped metal nanoparticle structure formed by annealing of a metal film; metal islands of the randomly-distributed island-shaped metal nanoparticle structure have an average diameter of 20-100 nm; and an average size of a gap between the metal islands is 50-300 nm.

7. A method of producing a silicon carbide-based full-spectrum-responsive photodetector, the silicon carbide-based full-spectrum-responsive photodetector comprising:
a silicon carbide substrate;
wherein a silicon surface of the silicon carbide substrate is provided with a plurality of metal counter electrodes and a surface plasmon polariton nanostructure; the plurality of metal counter electrodes are arranged on the silicon carbide substrate; the surface plasmon polariton nanostructure is arranged between the plurality of metal counter electrodes; the surface plasmon polariton nanostructure comprises a plurality of metal nanoparticles uniformly distributed on the silicon surface of the silicon carbide substrate; and a Schottky contact is formed between the plurality of metal counter electrodes and the silicon carbide substrate;
the method comprising:
(S1) calibrating a carbon surface and the silicon surface of the silicon carbide substrate by using an atomic force microscope; and cleaning and drying the silicon carbide substrate;
(S2) distributing the plurality of metal nanoparticles evenly on the silicon surface of the silicon carbide substrate to form the surface plasmon polariton nanostructure; and
(S3) preparing the plurality of metal counter electrodes on both sides of the surface plasmon polariton nanostructure to produce the silicon carbide-based full-spectrum-responsive photodetector.

8. The method of claim 7, wherein the step (S2) is performed through steps of:
putting the silicon carbide substrate into a magnetron sputtering coating chamber; coating a gold film with a thickness of 5 nm by sputtering at a rate of 0.1 nm/s on a side of the silicon carbide substrate where the silicon surface is located; transferring the silicon carbide substrate coated with the gold film to a muffle furnace; heating the muffle furnace to 500° C.; and cooling the muffle furnace to room temperature in an equal step manner within two hours to form island-shape gold nanoparticles; and
the step (S3) is performed through steps of:
loading a mask on the silicon carbide substrate, and depositing a metal layer on the silicon carbide substrate by evaporation; and
removing the mask to complete a preparation of the plurality of metal counter electrodes.

9. The method of claim 7, wherein the step (S2) is performed through steps of:
coating a polymethyl methacrylate (PMMA) photoresist film with a thickness of 80 nm on the silicon surface of the silicon carbide substrate through spin coating; and exposing the silicon carbide substrate coated with the PMMA photoresist film by deep ultraviolet lithography or electron beam lithography; wherein an exposure pattern is consistent with a pattern of the surface plasmon polariton nanostructure;
immersing the silicon carbide substrate into a developer solution for fixing followed by rinsing and blow drying; and
producing a Cr adhesion layer with a thickness of 5 nm and an Au film with a thickness of 50 nm on a surface of the silicon carbide substrate by magnetron sputtering; immersing the silicon carbide substrate in acetone to peel off unexposed PMMA photoresist and Cr and Au thereon; and subjecting the silicon carbide substrate to blow drying to complete preparation of the surface plasmon polariton nanostructure.

* * * * *